United States Patent [19]

Chantepie

[11] Patent Number: 4,808,851
[45] Date of Patent: Feb. 28, 1989

[54] ECL-COMPATIBLE SEMICONDUCTOR DEVICE HAVING A PREDIFFUSED GATE ARRAY

[75] Inventor: Bernard Chantepie, Gif-Sur-Yvette, France

[73] Assignee: U.S. Philips Corporation, New York, N.Y.

[21] Appl. No.: 14,502

[22] Filed: Feb. 13, 1987

[30] Foreign Application Priority Data

Feb. 18, 1986 [FR] France ................ 86 02150

[51] Int. Cl.$^4$ ..................................... H03K 19/094
[52] U.S. Cl. ................................ 307/450; 307/448; 307/475; 307/468
[58] Field of Search ............... 307/443, 448, 450, 475, 307/574, 581, 264, 468–469

[56] References Cited

U.S. PATENT DOCUMENTS

| | | | |
|---|---|---|---|
| 4,410,815 | 10/1983 | Ransom et al. | 307/448 X |
| 4,450,369 | 5/1984 | Schuermeyer | 307/475 X |
| 4,661,725 | 4/1987 | Chantepie | 307/450 |

OTHER PUBLICATIONS

Katsu et al, "A GaAs Monolithic Frequency Divider Using Source Coupled FET Logic", *IEEE Elect. Device Letters*, vol. EDL-3, No. 8, Aug. 1982, pp. 197–199.

Primary Examiner—David Hudspeth
Attorney, Agent, or Firm—Steven R. Biren

[57] ABSTRACT

A semiconductor device includes a prediffused array of elementary gates which constitute an integrated circuit (designated as a "custom made circuit") realized on gallium arsenide. The elementary gates which constitute the elements of the prediffused array realize OR/-NOR functions according to SCFL logic and constitute both internal gates for the "custom made circuit" and external gates compatible with ECL logic to directly connect the circuit thus formed to an external semiconductor device realized according to ECL logic.

5 Claims, 4 Drawing Sheets

FIG. 2a

ECL-COMPATIBLE SEMICONDUCTOR DEVICE HAVING A PREDIFFUSED GATE ARRAY

The invention relates to a semiconductor device having a predifussed array of elementary gates obtained by means of an integrated circuit technology on gallium arsenide for forming a so-called "custom made circuit" as an integrated circuit.

The term "custom made circuit" is to be understood to mean herein an integrated circuit obtained by collaboration between a circuit designer and a circuit user. The circuit designer propses integrated circuits essentially constituted by elementary gates or by blocks of elementary functions distributed in the form of an array over a substrate and devoid of interconnections. The designer is able to inform the user about all the characteristics of these gates or of these blocks of functions, such as, for example, their number, the technology according to which they are realized or with which they are compatible, their power consumption, their fan-in and fan-out, the position and the number of inputs and outputs, etc. In fact, the circuit proposed by the designer has first been "prediffused" and the gates or blocks have thus been tested.

Starting from a record of the loads supplied by the circuit designer, the user makes a "routing" plane, i.e. of interconnections between the gates or blocks suggested to him. After this stage, the circuit designer realizes the final circuit according to the "needs" of the user.

The consideration and positioning of the set of masks to realize the elementary gates or the blocks of functions, their distribution in an array on a semiconductor wafer, then their diffusion and the tests of their performance are effected by the designer.

Depending upon the need of the user, the geometric position of the basic elements, i.e. of the gates or groups of gates of variable complexity according to the type of logic chosen, is fixed. Only the personalization of the interconnections associated with the particular design and with its application must still be determined.

The record of the loads does not bring the set of masks for realizing the gates or the blocks of functions to the knowledge of the user. The latter appear to him in the form of an array of "black boxes" provided with inputs and outputs, each black box representing a logic function, for example OR, NOR, etc.

Consequently, the circuit designer will also form the set of masks for realizing the routing.

According to the prior art, the so-called ECL (Emitter Coupled Logic) logic realized on silicon remains a high-performance technology due to the fact that the gates have a very short propagation time. Therefore, it is currently used. Thus, numerous circuit users possess all or part of their equipment realized according to this technology.

However, the ECL logic has two disadvantages. The propgation time of a gate remains about twice the propagation time of a gate realized on gallium arsenide (GaAs). Moreover, the consumption of an ECL gate is about ten times higher than that of a gate realized on gallium arsenide.

Therefore, the users of integrated circuits want circuits of the "prediffused" type which are "custom made" and have the advantages of circuits realized on gallium arsenide and, as the case may be, are also compatible with the ECL logic.

The gates made nowadays as "prediffused" circuits on gallium arsenide are not compatible with the ECL logic. In fact they are only compatible with identical gates and therefore can be used only as "internal gates".

When a circuit realized by means of these gates must be made compatible with another logic, an interface circuit has to be provided at two levels. A first circuit level, at which the proportioning and the polarization of the transistors are changed with respect to the basic circuit in order to be able to act upon the second circuit level which constitutes the interface circuit just mentioned. The gates constituting the first level of the interface circuit are designated as "external gates".

In the manufacture of the "custom made circuits", the circuit designer in turn attempts to optimize the efficiency of the production, while maintaining the performance of the circuits.

It is clear that the imbrication in a "prediffuseed" circuit of internal and external gates differently proportioned and polarized is in contact with the realization of a simple array and therefore with the optimization of the efficiencies of manufacture of the designer of a "custom made circuit".

SUMMARY OF THE INVENTION

Therefore, the invention provides a solution of this problem by presenting an array of elementary gates of the kind defined above, whose gates can be utilized both as "internal gates" and as "external gates" compatible with ECL technology.

According to the invention, this array of gates is characterized in that the elementary gates constituting the elements of the prediffused array realize OR and NOR functions according to source-coupled FET logic and constitute both internal gates for the custom made circuit and external gates compatible with ECL logic to directly connect the circuit thus formed to an external semiconductor device realized according to ECL logic.

The gates of the array according to the invention then have the advantage that they can be used both as "internal gates" and as "external gates" compatible with ECL logic with the same direct supply voltages.

As "internal gates" they are capable of directly acting upon one or several gates of the same type. As "external gates" they supply an amplitude of 700 mV with an impedance of 60Ω to act upon an ECL gate. Moreover, they have the very short propagation times and the very low consumption characteristic of integrated circuits on gallium arsenide. As a result, the "prediffused array" realized by means of these gates can be very simply realized and has a high manufacturing efficiency. The routing to be provided by the user will then also be facilitated. The cost of the "custom made circuit" will then be reduced.

BRIEF DESCRIPTION OF THE DRAWING

In order that the invention may be readily carried out, it will now be described more fully with reference to the accompanying drawing, in which.

As stated above, a gate is said to be internal when its output signal acts directly upon a gate of the same type, while a gate is said to be external when its output signal is capable of acting directly upon a gate of a different type.

DESCRIPTION OF THE PREFERRED EMBODIMENTS

The gate chosen to realize the prediffused array of elementary gates (gate array) according to the invention permits realizing a whole logic family by virtue of its compatibility in fan-in/fan-out with the ECL logic family, its rapidity and its low consumption.

Figure 1A:
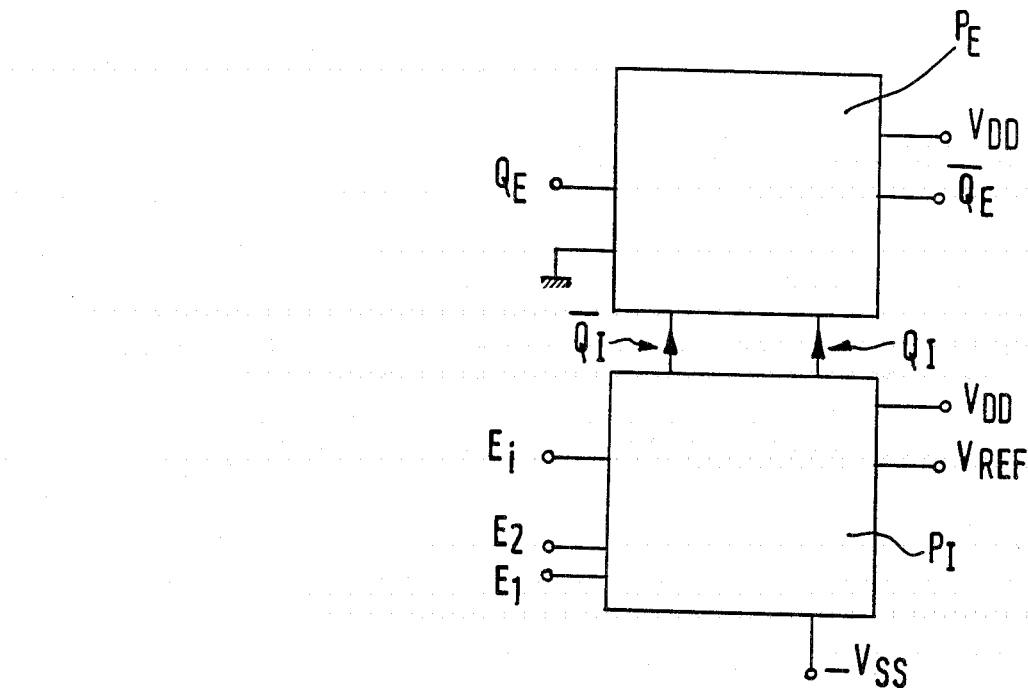
FIG. 1a shows an external gate according to the invention in the form of blocks.

As shown in FIG. 1a, the elementary gate according to the invention is apt to supply at its output $Q_E$ or its complementary output $\overline{Q_E}$ the same amplitude as at its input $E_i$, i.e. an amplitude of 700 mV obtained between the low level of 0.1 V and the high level of 0.8 V with a load of 60Ω/2 pF. These characteristics are wholly suitable to act directly upon a circuit realized according to ECL logic outside of the semiconductor device according to the invention. Moreover, the propagation time of this gate is very short with a load of the capacitive type.

Figure 2A:
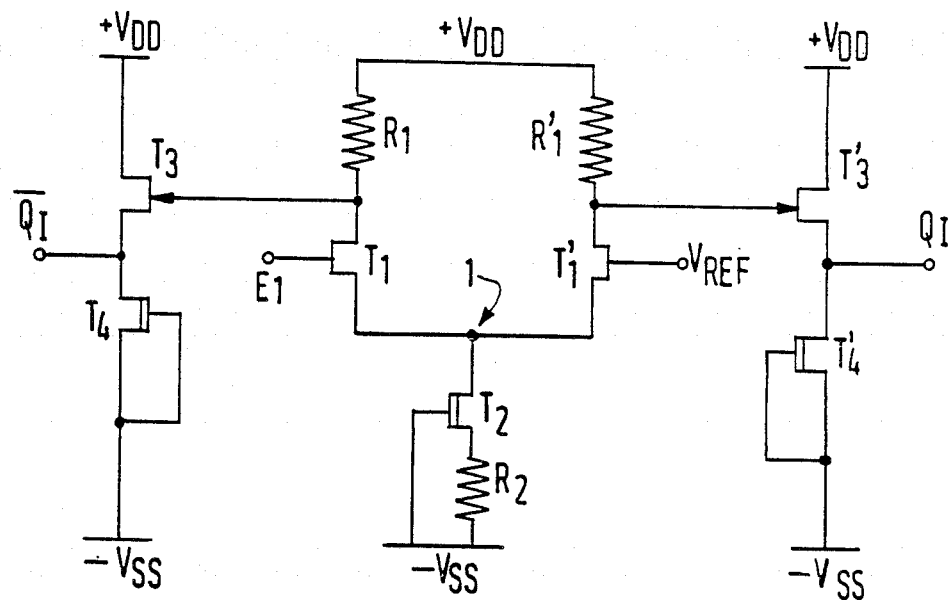
FIGS. 2a and 2b show in detail internal gates according to the invention.

The gate according to the invention is of the OR/NOR type derived from the so-called SCFL (Source Coupled Field effect transistor Logic). This gate is constituted by a first block $P_I$, whose internal structure is shown in FIG. 2, and by a second block $P_E$, whose internal structure is represented in FIG. 3.

The structure of the first block $P_I$ realizes the OR/NOR function just mentioned. As shown in FIG. 2a, it is constituted by two transistors $T_1$ and $T_1'$ of the normally pinched (normally-OFF) type in the absence of a gate-source signal coupled by their sources to the junction 1 and loaded by the loads $R_1$ and $R_1'$, respectively. The coupled sources are connected to a transistor $T_2$ of the normally conducting type in the absence of a gate-source signal (normally-ON) connected to a resistor $R_2$ and arranged as a current source connected to the negative direct voltage supply $-V_{SS}$. The loads $R_1$ and $R_1'$ are connected to the positive direct voltage supply $+V_{DD}$. The direct supply voltages $V_{DD}$ and $-V_{SS}$ are chosen to be symmetrical.

The gate of the transistor $T_1$ receives the input $E_1$ and the gate of the transistor $T_1'$ receives a reference voltage $V_{REF}$.

The outputs of the transistors $T_1$ and $T_1'$ connected between $R_1$ and $R_1'$, respectively, are passed to the follower transistors $T_3$ and $T_3'$ of a buffer stage connected to the transistors $T_4$ and $T_4'$ arranged as level translators. The center points of the buffer stage supply on the one hand a signal $\overline{Q_I}$ and on the other hand a signal $Q_I$, the first signal being the complement of the second signal. The transistors $T_3$ and $T_3'$ of the buffer stage are connected to the supply voltage $+V_{DD}$, while the transistors $T_4$ and $T_4'$ are connected to the voltage $-V_{SS}$.

An elementary gate realized according to the SCFL logic on gallium arsenide is already known from the prior art (see the publication by T. Takada et al in "Extended Abstracts of the Sixteenth International Conference on Solid State Devices and Materials, Kobe 1984, p. 403–406" entitled "A GaAs HSCFL 4 GHz divider with 60/70 ps transition time". This document describes a semiconductor circuit of the frequency divider type comprising an elementary gate according to the SCFL (Source Coupled Field effect transistor Logic) logic realized by means of depletion field effect transistors, whose pinch voltage is very low, i.e. of the order of $-1$ V, and of which the potential difference between the high level and the low level (logic voltage swing) is very large, i.e. of the order of 2.8 V; this accounts for the name given to the logic circuit constituted by such gates: HSCFL (High Logic Voltage Swing Source Coupled FET Logic). The circuit realized by means of this elementary gate has a high operating speed due to the fact that the cut-off frequency of the transistors thus polarized is very high.

In return, this known gate has a high consumption. Therefore, it is not possible to use it in the prediffused circuits in which densities of at least 2000 gates are aimed at. Moreover, like the other gates formed on gallium arsenide and used in the prediffused circuits, this gate is not compatible with other logics.

In the contrary, the gate according to the invention is compatible on the one hand with the gates of the same type and on the other hand with the ECL logic, as shown hereinafter.

Figure 2B:
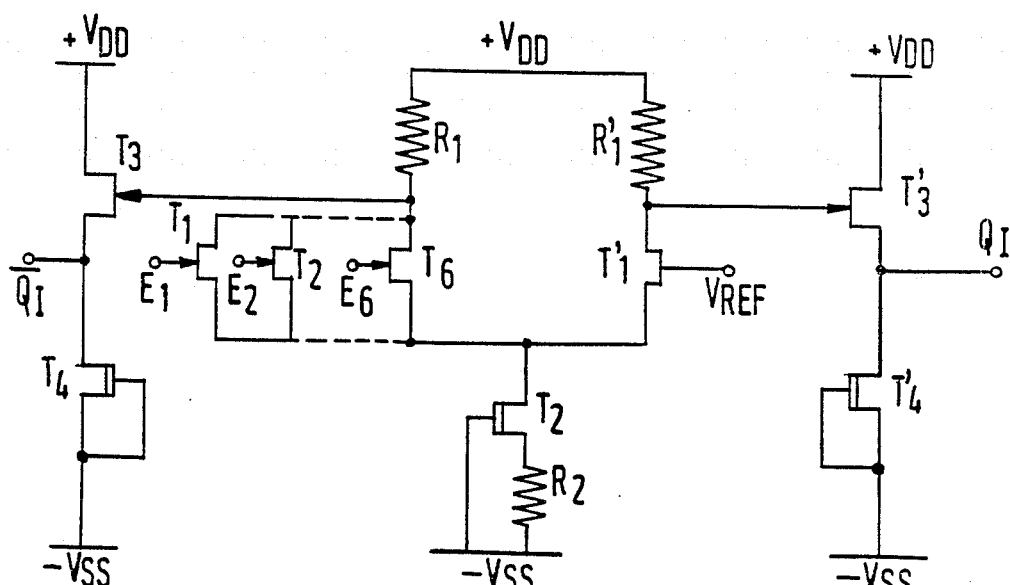
Figure 3:
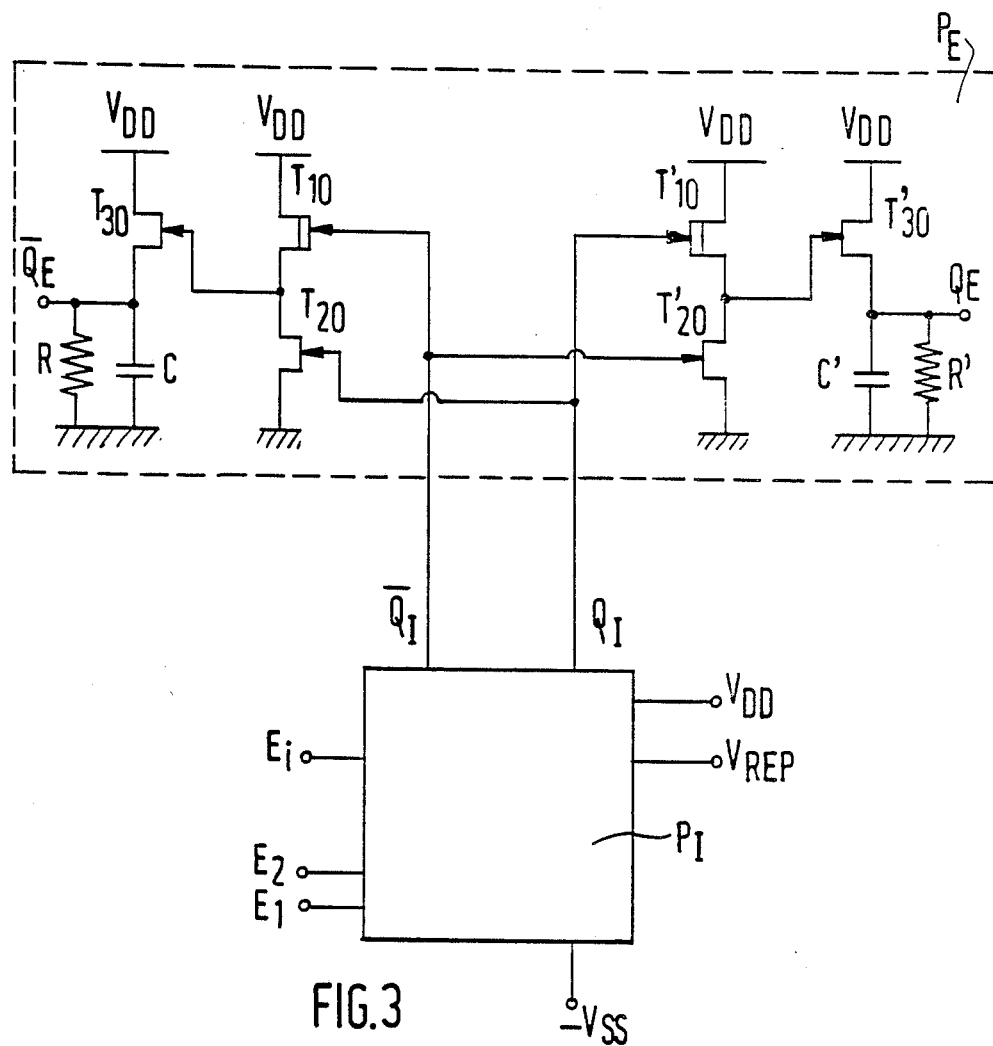
FIG. 3 shows in detail an external gate according to the invention.

As far as its compatibility with the gates of the same type is concerned, this elementary gate has a fan-in of 6, as shown in FIG. 2b.

Table I indicates the characteristics of the transistors and of the loads which in this embodiment are of the resistive type to obtain with this gate:
A fan-in FI=6,
a fan-out FO=4,
a propagation time tpd>75 ps,
and a power consumption P=10 mW.
The value of the supply voltages
$V_{DD}=+1.5$ V
$-V_{SS}=-1.5$ V.

An advantage ensues from the fact that the supply voltages $V_{DD}$ and $-V_{SS}$ are symmetrical because these supply voltages can readily be realized from an inversion, only a single direct supply voltage then being necessary.

TABLE I

| Transistors | Type | Gate length | Gate width |
|---|---|---|---|
| $T_1$ to $T_6$ | Enhancem. | 0.7 μm | 20 μm |
| $T'_1$ | Enhancem. | 0.7 μm | 40 μm |
| $T_2$ | Depletion | 0.7 μm | 18 μm |
| $T_3$, $T'_3$ | Enhancem. | 0.7 μm | 30 μm |
| $T_4$, $T'_4$ | Depletion | 0.7 μm | 17 μm |

| Load | Type | Value |
|---|---|---|
| $R_1$, $R'_1$ | Resistor | 1.8 KΩ |
| $R_2$ | Resistor | 0.7 KΩ |

The threshold voltage of the charge depletion transistors (normally ON) is $V_T=-0.8$ V.

The threshold voltage of the enhancement transistors (normally OFF) is $V_T=50$ mV.

These transistors have a saturation current $I_{DSS}$ at the gate-source voltage $V_{GS}=0.7$ V, which is:

$I_{DSS}=15$ mA for enhancement transistors having a gate width of 200 μm, and $I_{DSS}=44$ mA for the depletion transistors having a gate width of 200 μm, and a maximum transconductance:

$g_m=220$ mS/mm, both for the depletion transistors and for the enhancement transistors.

The reference voltage has been chosen such that:
$V_{REF}=0.4$ V.

In the embodiment described above, the elementary gate according to the invention therefore realizes the OR and NOR functions at the two output branches $Q_I$ and $\overline{Q}_I$. The proportioning is chosen for:

the minimization of the leakage effects which are added together at the six parallel-connected transistors $T_1$ to $T_6$ when the latter are in the cut-off state, the minimization of the influence of the fan-out by means of the shift buffer stages, ensurance of a stabilization of the current in the common mode.

The amplification of this gate in the embodiment described is:

$$G \simeq 1.8,$$

which permits obtaining a high rapidity while maintaining a minimum noise margin.

In accordance with the invention, the block $P_I$ shown in FIGS. 1a, 2a and 2b can constitute in itself internal circuit gates.

For its full compatibility with the ECL circuits, the outputs of the block $P_I$ are connected to the inputs of the block $P_E$, as shown in FIGS. 1a and 3.

This block $P_E$ is shown in detail in FIG. 3. The outputs $\overline{Q}_I$ and $Q_I$ of the block $P_I$ are connected to the respective gates of the high transistors $T_{10}$ and $T_{10}'$ of two push-pull stages, which moreover comprise the low transistors $T_{20}$ and $T_{20}'$. The latter receive the outputs $Q_I$ and $\overline{Q}_I$, respectively, of the block $P_I$, i.e. the signal complementary to that which is received by the high transistors. The high transistors of the push-pull stages are of the depletion type (normally ON) and are connected to the direct voltage supply $V_{DD}$. The low transistors of the push-pull stages are of the enhancement type and are connected to ground.

These push-pull stages are symmetrical. The signals derived at the center points of the push-pull stages are applied to buffer stages constituted for one push-pull stage by the transistor $T_{30}$, the resistor R and the capacitance C and for the other push-pull stage by the transistor $T_{30}'$, the resistor R' and the capacitance C'. The transistors $T_{30}$ and $T_{30}'$ are enhancement transistors (normally OFF) and are connected to the direct voltage supply $V_{DD}$. The outputs $\overline{Q}_E$ and $Q_E$ of the global elementary gate, totally compatible with ECL logic, are connected to the second electrode of the transistors $T_{30}$ and $T_{30}'$, respectively, which are connected to the resistor A and the capacitance C and to R' and C' connected in parallel for transistors $T_{30}$ and $T_{31}$, respectively. These resistors R and R' and these capacitances C and C' are on the other hand connected to ground.

As stated above, the characteristics of the elements of the block $P_E$ are chosen so as to obtain the same amplitude as at the gate input, this amplitude A being moreover the amplitude required for the compatibility with the ECL logic, i.e.:

A=700 mV between the low level at 0.1 V and at the high level at 0.8 V with the load constituted by:
R=R'=60Ω, and the capacitance
C=C'=2 pF.

The propagation time of the gate when the characteristics given in the Table II are taken into account is:
tpd=130 ps with 60Ω/2 pF.

$T_R$, $T_f$(20-80%)=160 ps,
and the power consumption:

P=35 mW while including the loads of 60Ω.

It should be noted that a great advantage ensues from the fact that the direct supply voltage is still $+V_{DD}=+1.5$ V, which simplifies the routing considerably. In fact, it is known that during the circuit implementation, the conductors routing the supply voltages, especially if they are numerous, occupy a large surface area.

TABLE II

| Transistors | Type | Gate length | Gate width |
|---|---|---|---|
| $T_{30}$, $T'_{30}$ | Enhancem. | 0.7 μm | 350 μm |
| $T_{10}$, $T'_{10}$ | Depletion | 0.7 μm | 90 μm |
| $T_{20}$, $T'_{20}$ | Enhancem. | 0.7 μm | 60 μm |

Figure 1B:
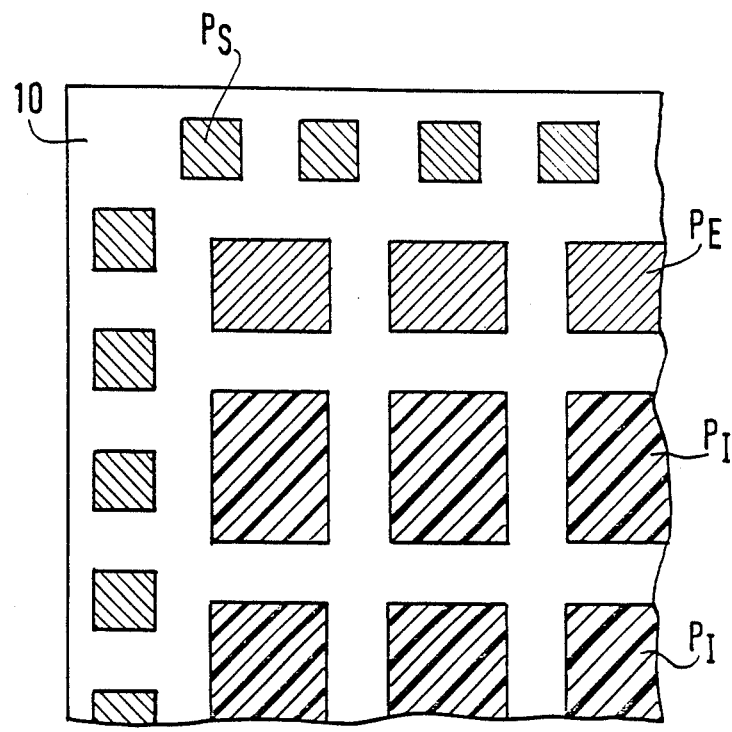
FIG. 1b shows a part of a prediffused array according to the invention in the form of blocks.

FIG. 1b shows an embodiment of a module of an array of gates as it appears to the user before the routing plan. The blocks $P_I$ and $P_E$ are distributed regularly over a substrate 10, preferably of gallium arsenide (or a compound of the III-V group). The blocks $P_S$ are metallic layers constituting the input/output contacts. FIG. 1b shows only a part of the substrate.

It is clear that in the practical construction of the sets of masks permitting the realization of the complete circuit on a semiconductor substrate, the use of a computer is required. This computer permits electric logic simulations, the generation of test vectors, the tracing of the topologies of implantation of the transistors and then of the blocks and the inter-connections.

On the other hand, it is clear that a technology such as proposed here is particularly favorable for the integration of a large number of gates due to very low consumption of each of them.

What is claimed is:

1. A semiconductor device comprising a gallium arsenide substrate, a prediffused array of elementary gates provided on said substrate to form an integrated circuit designated as a "custom made circuit", wherein the elementary gates comprising the elements of the prediffused array form OR/NOR gates in accordance with source-coupled FET logic (SCFL) and comprise both internal gates for the "custom made circuit" and external gates compatible with ECL logic, the external gates directly connecting the circuit thus formed to an external semiconductor device realized in accordance with ECL logic, said external gates being constituted by two interconnected circuit blocks, a first block $P_I$ comprising an internal gate and a second block $P_E$, the first block $P_I$ comprising a transistor $T_1'$ connected to a direct voltage supply $V_{DD}$ through a load R' controlled by a reference signal $V_{REF}$ and coupled by its source to a cascade of 1 to 6 transistors $T_1 \ldots T_6$, whose commonly-connected drains are connected to the voltage supply $V_{DD}$ through a load R, whose gates receive the control signals $E_1 \ldots E_6$, the commonly-connected sources of the transistors $T_1'$ and $T_1 \ldots T_6$ being supplied with current from a direct voltge $-V_{SS}$ on the one hand having the same absolute value as the voltage $V_{DD}$ and on the other hand such that:

$$-V_{SS} < V_{REF} < V_{DD},$$

by means of a field effect transistor $T_2$ and of a load $R_2$ constituting a current source, and is then constituted by two buffer stages constituted by a follower transistor $T_3$ and $T_3'$, respectively, connected to a transistor $T_4$ and $T_4'$, respectively, connected as level translators, the drain of the follower transistor $T_3$ or $T_3'$ being connected to the direct voltage supply $V_{DD}$ and the gate of the follower transistor $T_3$ or $T_3'$ being controlled by the signal derived from the commonly-connected drain of the transistors $T_1 \ldots T_6$ and $T_1'$, the outputs $\overline{Q}_I$ and $Q_I$ of the NOR and OR, respectively, being available at the source of the transistor $T_3$ on the one hand and at the source of the transistor $T_3'$ on the other hand.

2. A device as claimed in claim 1, characterized in that the transistors $T_1 \ldots T_6$, $T_1'$, $T_3$, $T_3'$ are enhancement field effect transistors, the transistors $T_2$, $T_4$, $T_4'$ are charge depletion field effect transistors and the load R, $R_1'$ and $R_2$ are resistive loads.

3. A device as claimed in claim 1 or 2, characterized in that the second block $P_E$ comprises two push-pull stages constituted by a high (pull-up) transistor $T_{10}$ and $T_{10}'$, respectively, whose drain is connected to the voltage $V_{DD}$, and by a low (pull-down) transistor $T_{20}$ and $T_{20}'$, respectively, whose source is connected to ground and which is constituted by two buffer stages constituted by a transistor $T_{30}$ and $T_{30}'$, respectively, controlled by output signals from the output of a push-pull stage, whose drain is connected to the direct voltage supply $V_{DD}$ and whose source is connected to ground through a load constituted by a resistor and by a capacitor connected in parallel, R, C and R', C', respectively, while each output $\overline{Q}_I$ or $Q_I$ of the first block $P_I$ ca be connected both to the high transistor of one the push-pull stages and to the low transistor of the other push-pull stage, the outputs $\overline{Q}_E$ and $Q_E$ of the block $P_E$ compatible with the ECL logic being available at the source of the transistors $T_{30}$ or $T_{30}'$ of the buffer stages.

4. A device as claimed in claim 3, characterized in that the transistors $T_{20}'$, $T_{20}$, $T_{30}$, $T_{30}'$ are enhancement field effect transistors and the transistors $T_{10}'$ and $T_{10}$ are charge depletion field effect transistors.

5. A device as claimed in claim 1 or 2, characterized in that the gates of the arrays are integrated on a substrate of gallium arsenide, as are metallic contacts $P_S$ for the inputs/outputs.

* * * * *